United States Patent
Karp

(10) Patent No.: US 10,015,916 B1
(45) Date of Patent: Jul. 3, 2018

(54) REMOVAL OF ELECTROSTATIC CHARGES FROM AN INTERPOSER VIA A GROUND PAD THEREOF FOR DIE ATTACH FOR FORMATION OF A STACKED DIE

(71) Applicant: Xilinx, Inc., San Jose, CA (US)

(72) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 284 days.

(21) Appl. No.: 13/898,895

(22) Filed: May 21, 2013

(51) Int. Cl.
  H05K 9/00 (2006.01)
  H05F 3/02 (2006.01)
  H05K 3/34 (2006.01)
  H01L 25/065 (2006.01)
  H05K 1/14 (2006.01)
  H05K 1/11 (2006.01)
  H01L 25/10 (2006.01)

(52) U.S. Cl.
  CPC ............. H05K 9/0067 (2013.01); H05F 3/02 (2013.01); H05K 3/341 (2013.01); *H01L 25/0657* (2013.01); *H01L 25/105* (2013.01); *H01L 2924/01078* (2013.01); *H01L 2924/01079* (2013.01); *H01L 2924/15311* (2013.01); *H05K 1/111* (2013.01); *H05K 1/112* (2013.01); *H05K 1/141* (2013.01); *H05K 1/144* (2013.01)

(58) Field of Classification Search
  CPC ......... H05K 9/0067; H05K 3/341; H05F 3/02
  See application file for complete search history.

(56) References Cited

U.S. PATENT DOCUMENTS

| | | | |
|---|---|---|---|
| 5,206,181 A | 4/1993 | Gross | |
| 5,354,955 A | 11/1994 | Gregor et al. | |
| 6,121,677 A | 9/2000 | Song et al. | |
| 6,159,826 A | 12/2000 | Kim et al. | |
| 6,365,975 B1 | 4/2002 | DiStefano et al. | |
| 6,753,595 B1* | 6/2004 | Lin | H01L 23/49838 174/255 |
| 6,836,397 B2* | 12/2004 | Chen | H01T 4/08 174/259 |
| 7,378,735 B2* | 5/2008 | Lin | G01R 31/2884 257/738 |
| 7,795,713 B2* | 9/2010 | Matsui | H01L 23/60 257/678 |
| 8,030,775 B2* | 10/2011 | Lin | H01L 21/76801 257/758 |

(Continued)

FOREIGN PATENT DOCUMENTS

EP  1 017 094 A2  7/2000

OTHER PUBLICATIONS

U.S. Appl. No. 14/024,543, filed Sep. 11, 2013, Hart, Michael J. et al., Xilinx, Inc. San Jose, CA USA.

(Continued)

*Primary Examiner* — Binh Tran
*Assistant Examiner* — Douglas Burtner
(74) *Attorney, Agent, or Firm* — W. Eric Webostad; Joshua Hamberger; Keith Taboada

(57) ABSTRACT

An apparatus relating generally to an interposer is disclosed. In such an apparatus, the interposer has a plurality of conductors for coupling an integrated circuit die to the interposer to provide a stacked die. The interposer includes a pad coupled to a conductive network of the interposer to dissipate electrostatic charge from the interposer.

14 Claims, 6 Drawing Sheets

(56) References Cited

U.S. PATENT DOCUMENTS

| | | | | |
|---|---|---|---|---|
| 8,674,507 B2* | 3/2014 | Chou | | H01L 24/03 257/748 |
| 8,866,229 B1* | 10/2014 | Fakhruddin | | H01L 23/60 257/173 |
| 9,337,138 B1* | 5/2016 | Abugharbieh | | H01L 23/5385 |
| 2002/0168798 A1* | 11/2002 | Glenn | | H01L 21/56 438/113 |
| 2004/0056339 A1* | 3/2004 | Troost | | H01L 23/62 257/678 |
| 2004/0227163 A1 | 11/2004 | Sakamoto et al. | | |
| 2004/0256717 A1 | 12/2004 | Suenaga et al. | | |
| 2007/0152316 A1 | 7/2007 | Ryu et al. | | |
| 2008/0203567 A1* | 8/2008 | Kondo | | H01L 23/60 257/738 |
| 2008/0251788 A1 | 10/2008 | Maruyama | | |
| 2008/0265421 A1* | 10/2008 | Brunnbauer | | H01L 21/561 257/758 |
| 2008/0284037 A1 | 11/2008 | Andry et al. | | |
| 2009/0079071 A1* | 3/2009 | Webb | | H01L 23/49833 257/738 |
| 2009/0180225 A1* | 7/2009 | Pan | | H01L 23/60 361/56 |
| 2009/0262475 A1* | 10/2009 | Darabi | | H01L 23/60 361/56 |
| 2009/0315157 A1* | 12/2009 | Drost | | H01L 23/48 257/664 |
| 2010/0103058 A1* | 4/2010 | Kato | | G06K 19/07749 343/702 |
| 2010/0016405 A1 | 7/2010 | Furumiya et al. | | |
| 2010/0258949 A1* | 10/2010 | Henderson | | H01L 21/67092 257/777 |
| 2011/0260318 A1* | 10/2011 | Eisenstadt | | G06F 17/5054 257/737 |
| 2012/0002392 A1* | 1/2012 | Karp | | H01L 23/60 361/820 |
| 2012/0049389 A1* | 3/2012 | Verma | | H01L 22/32 257/786 |
| 2012/0133032 A1* | 5/2012 | Tsai | | H01L 23/552 257/659 |
| 2012/0153433 A1* | 6/2012 | Yen | | H01L 27/0248 257/531 |
| 2012/0182650 A1* | 7/2012 | Chi | | H01L 23/60 361/54 |
| 2012/0319717 A1* | 12/2012 | Chi | | G01B 31/318513 324/756.05 |
| 2013/0027073 A1* | 1/2013 | Pagani | | G01R 31/2889 324/756.03 |
| 2013/0063843 A1* | 3/2013 | Chen | | H01L 23/552 361/56 |
| 2013/0200509 A1* | 8/2013 | Kim | | H01L 23/36 257/692 |
| 2013/0256913 A1* | 10/2013 | Black | | H01L 25/0657 257/777 |
| 2014/0002122 A1 | 1/2014 | Dibattista et al. | | |
| 2014/0167799 A1* | 6/2014 | Wang | | H02H 9/046 324/750.14 |
| 2015/0327367 A1 | 11/2015 | Shen et al. | | |

OTHER PUBLICATIONS

McAteer, Owen J., "Electrostatic Discharge Control", Chapter Fifteen, p. 414, McGraw-Hill, NY, 1989.

\* cited by examiner

REMOVAL OF ELECTROSTATIC CHARGES FROM AN INTERPOSER VIA A GROUND PAD THEREOF FOR DIE ATTACH FOR FORMATION OF A STACKED DIE

FIELD OF THE INVENTION

The following description relates to integrated circuit devices ("ICs"). More particularly, the following description relates to a ground pad on an interposer for dissipation of electrostatic charge for die attach for formation of a stacked die.

BACKGROUND

Integrated circuits have become more "dense" over time, i.e., more logic features have been implemented in an IC of a given size. Unfortunately, having all components on a single die IC has become problematic. Fortunately, multiple die may be stacked to provide a stacked die IC ("stacked die"). Such stacked die may allow for lower power consumption, less current leakage, greater performance, and/or smaller IC size, among other benefits, as compared with trying to form a comparable single die IC. However, by attaching one or more integrated circuit dies to an interposer to form a stacked die, there are risks of damage associated to such one or more integrated circuit dies which are not present in formation of a single die IC. These damage risks may reduce yield and/or reliability of stacked dies.

Hence, it is desirable and useful to mitigate one or more of such risks of damage to increase stacked die yield and/or reliability.

SUMMARY

An apparatus relates generally to an interposer. In such an apparatus, the interposer has a plurality of conductors for coupling an integrated circuit die to the interposer to provide a stacked die. The interposer includes a pad coupled to a conductive network of the interposer to dissipate electrostatic charge from the interposer.

A method relates generally to providing a stacked die. In such a method, an interposer, having a plurality of conductors for coupling an integrated circuit die to the interposer to provide the stacked die, is loaded. The interposer is grounded with a grounded probe. The grounded probe is put in mechanical contact with a pad on the interposer for the grounding thereof to dissipate electrostatic charge from the interposer. The integrated circuit die is coupled to the interposer while grounded via the grounded probe to provide the stacked die.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIGS. 2-1 through 2-3 are respective block diagrams depicting an exemplary process flow for formation of a stacked die from a side view for wafer-scale or chip-scale fabrication.

FIG. 3 is a block diagram from a top view depicting an exemplary an interposer wafer.

DETAILED DESCRIPTION

Figure 1:
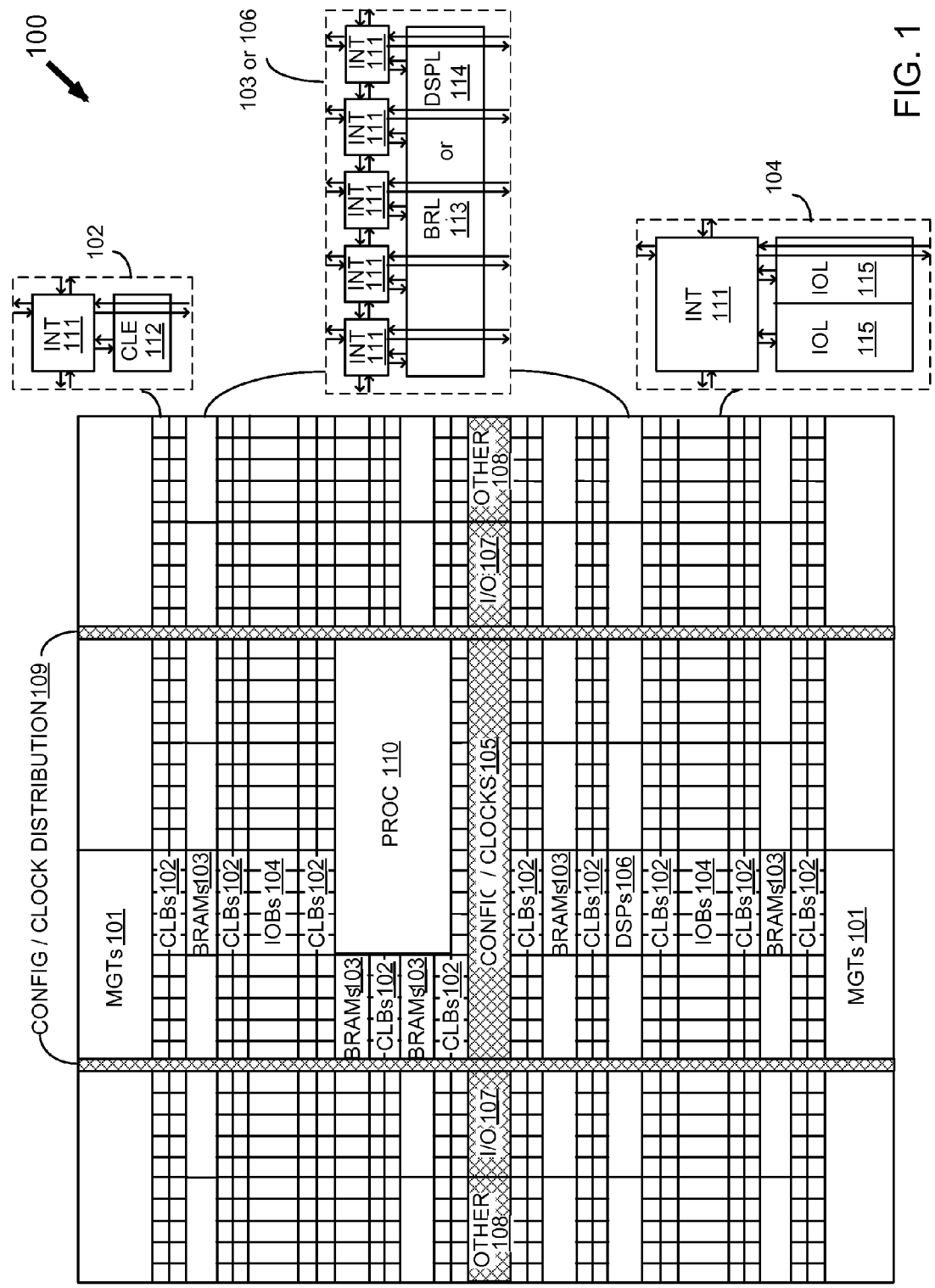
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Recently, multiple dies have been packaged to form a stacked die, where such stacked die includes an interposer die ("interposer") to which one or more integrated circuit dies are coupled. To make such an interposer in a cost effective manner, such interposer has been made as a passive die. Generally, a passive die is a die without any active devices. Unfortunately, such an interposer as a passive die may not have any conventional ESD protection, and adding conventional ESD protection to such a passive die may add considerable cost to formation of such interposer. Furthermore, such interposer may be exposed to processing which uses substantial ionic charges, such as plasma discharges for example, as well as ESD from handling. Because such interposer may collect charged particles, it may be a source of discharge to an integrated circuit die when coupled thereto ("die attach"). A bare integrated circuit die may not have all of its pins protected and/or sufficiently protected against one or more of such discharges, and thus such integrated circuit die may be damaged by such discharge of interposer surface charge to such integrated circuit die.

To mitigate against such damage, an interposer may be formed with ground pads for grounding such interposer during die attach. A probe or probe pin ("probe") may be grounded and put in contact with a ground pad prior to attaching any integrated circuit die to such interposer. Such probe may be removed from contact with such a ground pad when no other integrated circuit die is to be attached to such interposer for such a die attach operation.

With the above general understanding borne in mind, various embodiments for interposers, and formation thereof, are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Even though the following description is in terms of a stacked die to provide an FPGA or other SoC, the following description is not limited to FPGAs, SoCs, or any particular type of stacked die. Rather the following description applies to any stacked die assembly having an interposer for reasons which shall become apparent from the following description.

Figure 2:
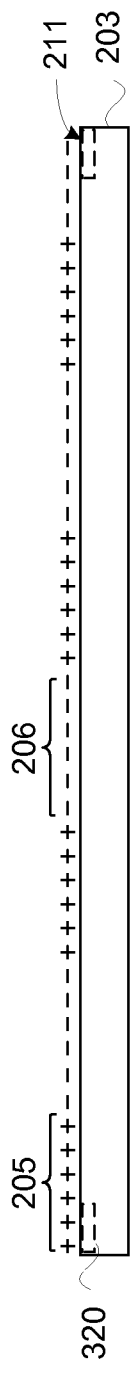
Figure 1:
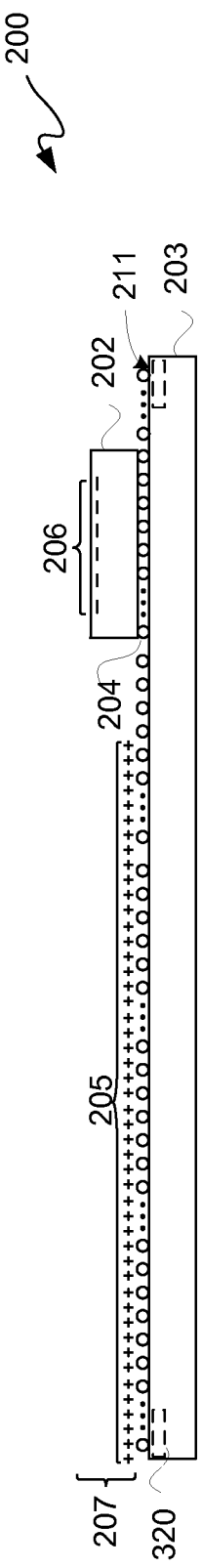
Figure 3:
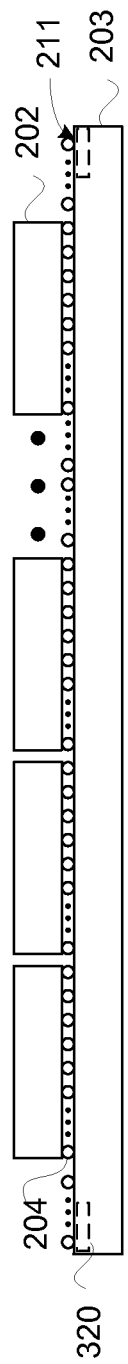
Figure 3:
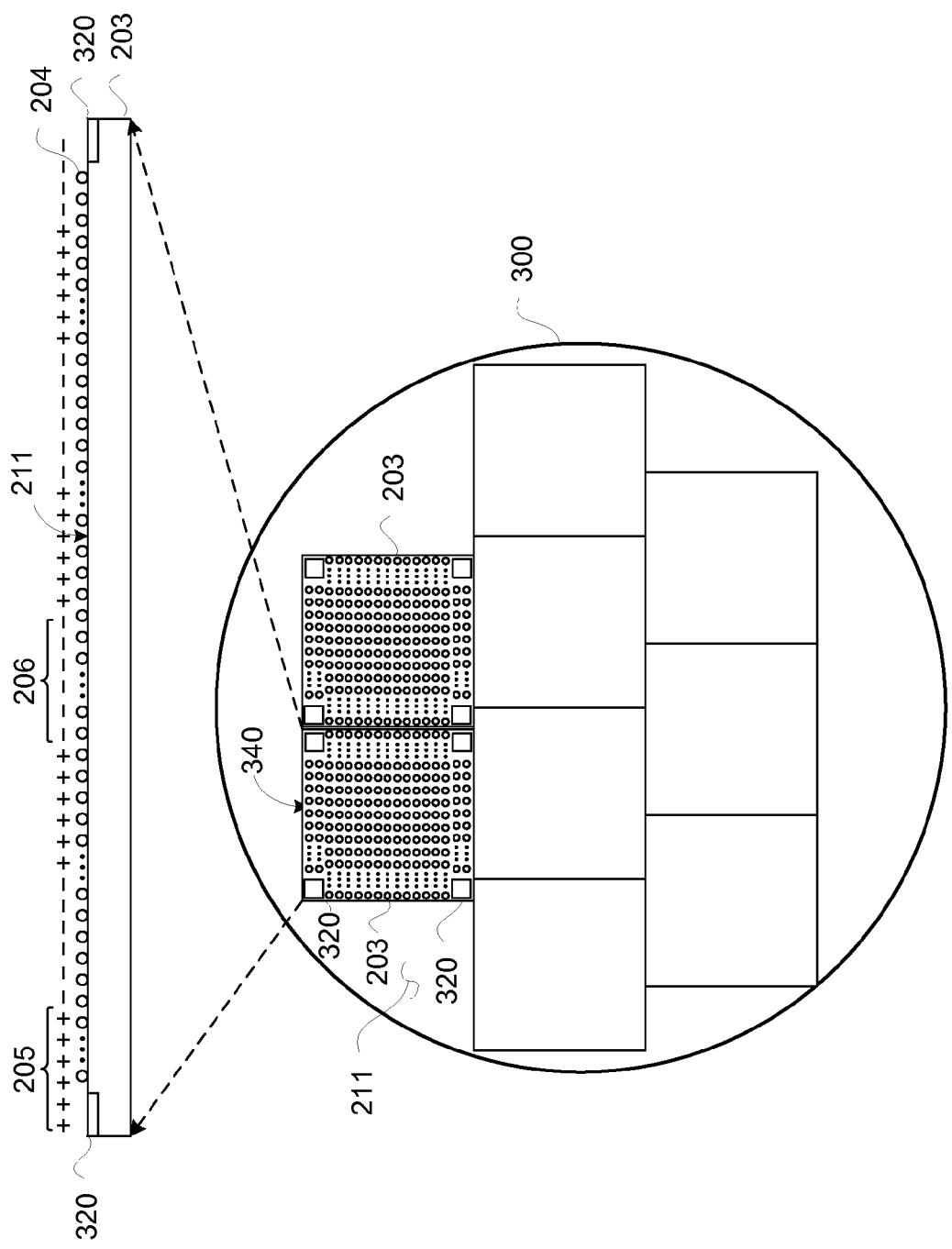

FIGS. 2-1 through 2-3 are respective block diagrams depicting an exemplary process flow for formation of a multiple die or stacked die IC ("stacked die") 200 from a side view for a wafer-scale or chip-scale fabrication. With simultaneous reference to FIGS. 2-1 through 2-3, 3-1, and 3-2, charges, such as generally depicted as positive charges 205 and negative charges 206, may collect a front side surface 211 of interposer 203. Interposer 203 includes one or more ground pads 320, as described below in additional detail.

An interposer 203 has a top or front side surface 211 to which one or more integrated circuit dies 202 may be coupled, such as via micro bumps 204 for example. Integrated circuit dies 202 may include one or more of an FPGA die, a power supply die, a memory die, an optical interface die, and/or a graphics processor die, or any other type or types of integrated circuit die. One or more of such integrated circuit dies 202 may be susceptible to damage from surface charge discharge from interposer 203, as described below in additional detail. When attached to interposer 203, one or more integrated circuit dies 202 may have been previously tested, namely may be "known good die." Thus, damage to a known good die may be linked to a die attach operation.

Interposer 203 may still be part of an interposer wafer, as described below in additional detail. In other words, an interposer wafer may or may not have been diced at this juncture. This is generally referred to as a chip-on-wafer flow or CoW flow. Optionally, interposer 203 may have been diced from an interposer wafer at this juncture, and then have one or more of integrated circuit dies attached to it. This is generally referred to as a chip-on-chip flow or CoC flow. In either of such flows, an under fill may be injected between integrated circuit dies and a mold compound may be used to effective bind together integrated circuit dies 202; however, such under fill and mold compound are not illustratively depicted here for purposes of clarity and not limitation. Furthermore, for purposes of clarity and not limitation, it shall be assumed that a CoW flow is used, even though either a CoW flow or a CoC flow may be used.

Interposer 203 may include a substrate. For purposes of clarity and not limitation, a silicon substrate may be used; however, in other instances another type of material or combination of materials may be used as a semiconductor substrate. Furthermore, in yet other instances, a dielectric substrate, such as a silicon oxide or other dielectric substrate for example, may be used for interposer 203. Conductive layers, such as horizontal metal layers and/or vertical via layers, may be insulated from one another by inter-dielectric layers ("ILDs"). Whether a dielectric or semiconductor substrate is used for interposer 203, such substrate with may be subject to an electrical floating body effect. The following description is applicable to either or both a dielectric or semiconductor substrate for interposer 203.

A portion of micro bumps 204 may be for interconnects for electrical conductivity with one or more of integrated circuit dies 202. These interconnects may include one or more ground buses and one or more power buses. For purposes of clarity and not limitation, a single ground network and a single supply voltage network are described below in additional detail. However, multiple power and/or ground networks may be included in interposer 203.

With reference to FIG. 2-1, when an initial integrated circuit die 202 is coupled to interposer 203 via micro bumps 204, it may be susceptible to a large positive charge from positive surface charge 205. In other words, such initial integrated circuit die 202 may see the entirety of surface charge 205. For purposes of clarity by way of example and not limitation, an initial integrated circuit die 202 may have a negative charge 206 and when combined with a positive surface charge 205, a potential difference 207 may result. This potential difference 207 may cause an ESD or other electrical discharge into such initial integrated circuit die 202. Such discharge may render one or more devices of integrated circuit die 206 inoperable and/or may significantly damage one or more devices such that they do not properly work or are unreliable. As a side, if surface charge were negative and an integrated circuit die 202 had a positive charge, then potential difference 207 would be of an opposite polarity. More particularly, such ESD or other electric discharge would be in a direction away from integrated circuit die 202. Such a discharge is more likely to have a negative impact on interposer 203 than integrated circuit die 202. The following description is applicable to either or both directions of electrical discharge. However, for purposes of clarity and not limitation, protection of integrated circuit dies 202 is generally described below. One or more integrated circuit dies 202 may be coupled to interposer 203 via micro bumps 204; however, generally a first one or two coupled integrated circuit dies 202 feel the brunt of ESD.

During fabrication of a stacked die 200, sometimes referred to as Stacked Silicon Interconnect Technology or SSIT, an interposer or interposer wafer may be exposed to charged particles. These charged particles may be positive and/or negative. Such charges may come from any of a number of possible sources, including without limitation exposure to a plasma of a plasma-enhanced chemical vapor deposition ("PECVD"), exposure to a plasma of plasma etch ("dry etch"), and/or electrostatic discharge from handling, among other possible sources of exposure to charged particles.

These charges 205 and/or 206 may result in a potential difference 207 between such front side surface 211 and source-drain junctions, or more generally p-n or n-p junctions ("p-n" is used interchangeably to refer to either or both types of junctions unless expressly indicated otherwise) of transistors and other devices formed in one or more of integrated circuit dies 202.

At this point it is assumed that interposer 203 is what is referred to as a "passive" interposer. In a conventional integrated circuit die, transistors can be protected from plasma damage by antenna rules that limit an area ratio of metal and gate sizes. Furthermore, a conventional integrated circuit die may have Electrostatic Discharge ("ESD") protection circuits. However, for a stacked die, to reduce cost of interposer formation, interposers may only have passive components. For example, a passive interposer may only have micro bumps, metal interconnects, TSVs, under bump metallization ("UMB"), and C4 balls. These passive components may have large widths, lengths, and/or height to reduce resistance-capacitance ("RC") delays. Furthermore, a high density metal layout of an interposer may make a high antenna ratio a significant risk. Along those lines, if charges 205 and/206 are given a conductive path to p-n junctions of an integrated circuit die 202, such charges may cause significant damage, which may cause a device associated therewith to subsequently prematurely fail or be inoperable. Such conductive path or paths are presented during die attach, when an integrated circuit die 202 is coupled to an interposer 203.

FIG. 3 is a block diagram depicting an exemplary an interposer wafer ("wafer") 300 from a top view. Wafer 300 may include a plurality of interposers 203. A front side surface 211 of wafer 300 is illustratively depicted. Even though a back side surface may have charge accumulation, front side surface 211 charge accumulation on interposer wafer 300 is more relevant to die attach.

Interposer 203 has an array 340 of a plurality of conductors for coupling one or more integrated circuit die 202 to interposer 203 to provide a stacked die integrated circuit, namely a stacked die 200. Along those lines, each of interposers 203 of wafer 300 may have such an array 340 though only illustratively depicted for two of such interposers 203. Furthermore, each of interposers 203 of wafer 300 may have one or more ground pads 320, such ground pads 320 may be coupled to one or more conductive networks, as described below in additional detail, of such interposers.

In this example, ground pads 320 are located at or on a periphery of array 340 of such plurality of conductors. More particularly, four ground pads 320 are respectively located in the four distal corners of front side surface 211 of interposers 203. However, in another example, ground pads may be located in these and/or one or more other locations on front side surface 211 of interposers 203. Furthermore, such plurality of conductors may include micro bumps 204, as more easily seen in the cross-sectional enlarged side view of FIG. 3 of an interposer 203 of wafer 300. Both ground pads 320 and array 340 of micro bumps 204 may are located on a front side surface 211 of interposers 203.

Figure 4:
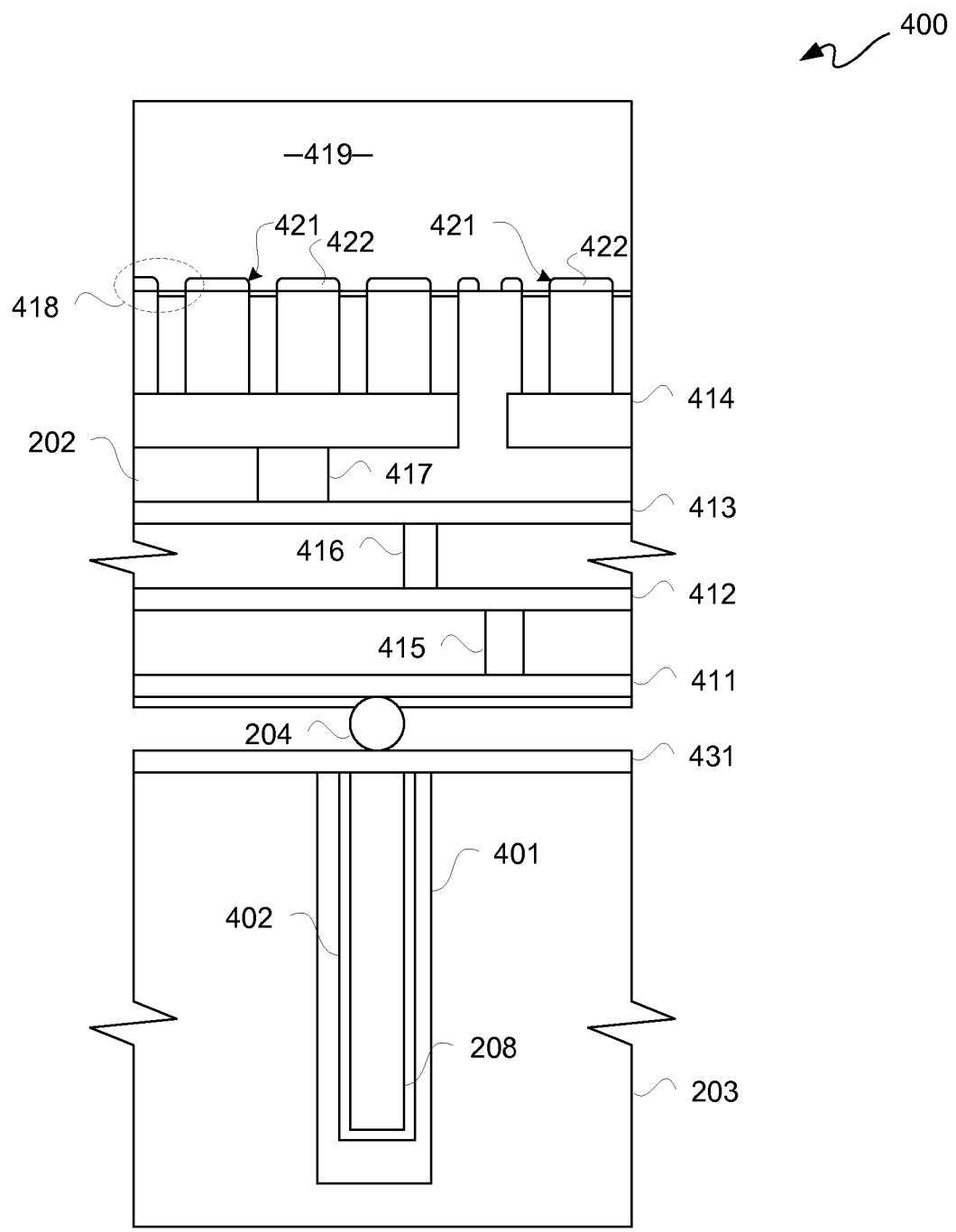
FIG. 4 is a block diagram of a cross-sectional side view depicting an exemplary portion of a stacked die of FIG. 2-2 or 2-3.

FIG. 4 is a block diagram of a cross-sectional side view depicting an exemplary portion 400 of a stacked die 200 of FIG. 2-2 or 2-3.

In FIG. 4, a through-substrate via ("TSV") 208, which may be formed with copper and may have one or more barrier layers 402 and a dielectric layer 401, of an interposer 203 may be coupled to a metal layer 431 of such interposer. Metal layer 431 may be coupled to a metal layer 411 of integrated circuit die 202 through a micro bump 204.

Metal layer 411 may be coupled to one or more other metal layers, such as metal layers 412 and 413 for example, through one or more metal via layers, such as via layers 415 and 416, respectively. Another via layer, such as via layer 417 may be used to couple metal layer 413 to metal layer 414. Metal layer 414 may be coupled to gate stacks, source regions, drain regions, and/or body regions of transistors 418. Substrate 419 of integrated circuit die 202 may have multiple p-n junctions 421 formed therein, including source and drain regions 422.

Charge may accumulate on a front side surface 211, and thus during die attach of an interposer wafer 300 or interposer 203 for micro bump 204 attachment of one or more top integrated circuit dies 200, there may be damage to one or more of such integrated circuit dies, or to an interposer 203 to which they are coupled, if such interposer 203 is not grounded during such die attach.

Figure 5:
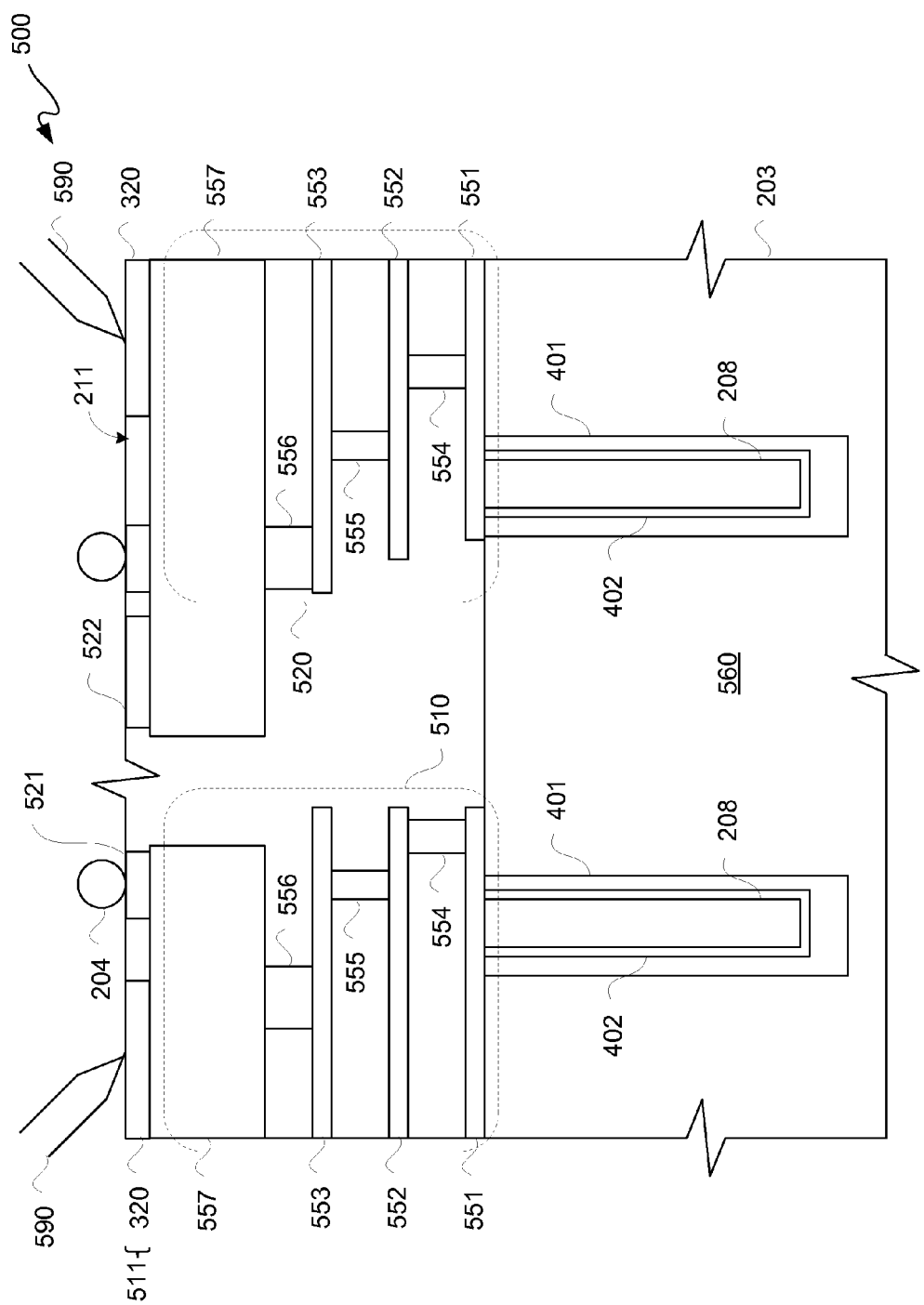
FIG. 5 is a block diagram of a cross-sectional side view depicting an exemplary portion of an interposer, which may be of the interposer wafer of FIG. 3.

Along those lines, with reference to FIG. 5, where there is shown a block diagram of a cross-sectional side view depicting an exemplary portion 500 of an interposer 203, which may be of an interposer wafer 300 of FIG. 3.

Interposer 203 includes a substrate 560, which may be a semiconductor substrate or a dielectric substrate such as previously described. Multiple TSVs 208 may be formed in substrate 560, such as previously described. Interposer 203 may include multiple conductive layers. In this example, a conductive layer 551 is coupled to TSVs 208. Conductive layer 551, which may be a metal layer, may be coupled to one or more other conductive layers 552 and 553 for example, which may be metal layers, through one or more conductive via layers 554 and 555, respectively, for example. Via layers 554 and 555 may be metal via layers. Metal layers 551 through 552 and via layers 554 and 555 may all be copper-based conductive layers for example. Additionally, a via layer 556 may couple conductive layer 553 to conductive layer 557. Conductive layer 557 may be coupled to ground pads 320 of a front side surface 211. Ground pads 320 may be formed of a metal layer 511 used to form pads 521 for micro bumps 204 and/or to form probe pads. Conductive layer 557 and via layer 556, as well as pads 320, 521, and 522, may all be metal-based layers, such as aluminum layers for example.

Ground pads 320 are larger than micro bumps 204 and pads 521 therefor. Ground pads 320 may be larger than or the same size as probe pads. Along those lines, a grounded probe or probe pin ("grounded probe") 590 may be put in contact with a corresponding ground pad 320 to provide a reference ground prior to attaching an integrated circuit die 202 to interposer 203. Grounded probe 590 is not part of interposer 203, but may be put in mechanical contact with and subsequently removed from such mechanical contact with a ground pad 320 of interposer 203.

As interposer 203 may be electrically floating, proper grounding of an interposer 203 prior to or as part of die attach may protect one or more integrated circuit dies 202. Along those lines, charge buildup on front side surface 211 may cause damage, such as electro-migration, to an integrated circuit die 202, and such charge buildup may be substantially dissipated by touching one or more grounded probes 590 to corresponding ground pad 320 prior to attaching such integrated circuit die 202.

With additional reference to FIGS. 2-1 through 2-3, 3, and 4, interposer 203, or interposer wafer 300, may have surface charges 205 and/or 206. During die attach, there may be a conductive path, or discharge path, to one or more p-n junctions of one or more of integrated circuit dies 202. Again, this discharge path may cause premature failure or inoperability of one or more devices of such integrated circuit dies 202. Charge accumulation can be so high in some instances that transistors suffer source-drain punch through and/or silicide loss as a result of thermal "burnouts" and electro-migration, respectively. However, by grounding with use of one or more ground pads 320, such damage may be avoided or at least substantially mitigated to increase yield and/or reliability.

To enhance use of such ground pads 320, one or more ground pads may be coupled to one or more of the largest conductive networks on and/or in interposer 203. For example, conductive network 510 and/or 520 may be a ground network, namely a Vss network. Interposer 203 may have one or more of such ground networks, and thus one or more ground pads 320 may correspondingly be used. Furthermore, for example, one or more of conductive networks 510 and/or 520 may be a supply voltage network. Interposer 203 may have one or more of supply voltage networks, and thus one or more ground pads 320 may correspondingly be used. For purposes of clarity by way of example and not limitation, it shall be assumed that conductive network 510 is a ground network and that conductive network 520 is a supply voltage network.

There may be many ground connections, namely multiple micro bumps 204 of array 340, coupled to ground network 510. There may be many supply voltage connections, namely multiple other micro bumps 204 of array 340, coupled to supply voltage network 520. Effectively, this means that by at least coupling a single ground pad 320 to a substantially large conductive network of interposer 203, such as ground network 510 for example, a substantial portion of surface 211 of interposer 203 is grounded by touching grounded probed 590 to such single ground pad. Optionally, for further protection, or possibly instead of using ground network 510, by at least coupling a single ground pad 320 to a substantially large conductive network of interposer 203, such as supply voltage network 520 for example, a substantial portion of surface 211 of interposer 203 is grounded by touching grounded probed 590 to such single ground pad. Generally, a largest conductive network that covers a large are with respect to surface 211 may be coupled to a ground pad 320 for providing a reference ground on interposer 203 for die attach. An interposer 203 may have a front side surface 211 which is substantially larger than any area of any integrated circuit die 202 coupled thereto. Thus, by having a wide spread network to provide a reference ground, likelihood of significant damage due to surface charge discharge over such a large surface area of interposer 203 is substantially reduced. Along those lines, there may be pockets of small surface charges remaining; however, integrated circuit dies 202 may have ESD devices that are sufficiently robust to withstand such small surface charges.

Furthermore, density of array 340 is substantial, and micro bumps 204 are small and soft. It may take specialized equipment to contact an individual ground micro bump 204 with a specialized probe pin for the task. However, by having a large ground pad 320, such specialized equipment may be avoided along with the cost associated therewith. Thus, a dummy ground pad 320 may be used, where such ground pad 320 is not used for grounding a stacked die 200 after completed assembly thereof. However, a "real" ground pad 320 may likewise be used, namely a ground pad of a stacked die 200 that is used for grounding after completed assembly of such stacked die.

Figure 6:
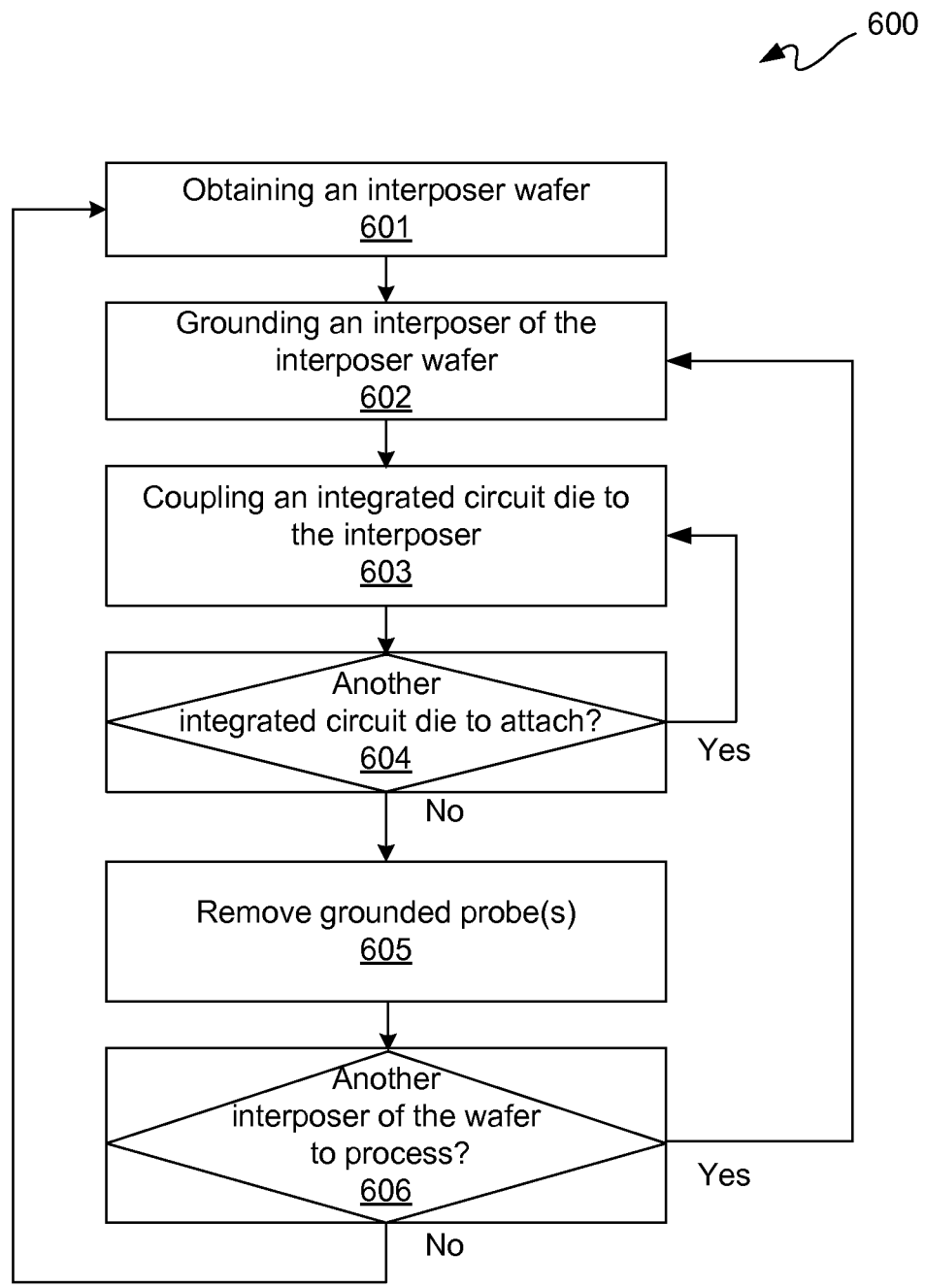
FIG. 6 is a flow diagram depicting an exemplary die attach flow for formation of one or more stacked dies of FIG. 2-2 or 2-3.

FIG. 6 is a flow diagram depicting an exemplary die attach flow 600 for formation of one or more stacked die 200 of FIG. 2-2 or 2-3. Flow 600 is further described with simultaneous reference to FIGS. 2-3, 3, 5 and 6.

At 601, flow 600 is initiated by obtaining an initial interposer wafer 300. It is assumed that such interposer wafer 300 has already been through a wafer sort, where all interposers 203 of such interposer wafer 300 may be tested. Any interposer 203 not passing such wafer sort test may be identified, so as not to use such interposer for die attach. At 602, an interposer 203 of such interposer wafer 300 is grounded. Along those lines, at least one grounded probe 590 is put in mechanical contact with at least one corresponding ground pad 320 of such interposer 203. This mechanical probing, which may be automatically carried out by a machine, with a grounded probe 590 by contacting a dedicated ground pad 320 may be to remove or dissipate electrostatic charge on such interposer 203 having such dedicated ground pad 320. This provides a reference ground for a front side surface 211 of such interposer, as previously described.

At 603, an integrated circuit die 202, such as a known good die for example, is coupled to such interposer grounded at 602. Thus, this coupling of an integrated circuit die 202 is performed while such interposer 203 is grounded by at least one grounded probe 590 as described with reference to operation 602. Such coupling may be through a portion of array 340.

At 604, it may be determined whether there is another integrated circuit die 202 to be coupled to such interposer 203 grounded at 602. If it is determined at 604 that there is another integrated circuit die 202 to be coupled to such interposer, then at 604 such other integrated circuit die is obtained for coupling at 603. Such other integrated circuit die 202 may be attached to interposer 203 while maintaining grounding thereof to provide a stacked die 200. If, however, it is determined at 604 that there is not another integrated circuit die 202 to be coupled to such interposer, then at 605 one or more grounded probes 590 used to ground such interposer at 602 may be removed from mechanical contact with one or more corresponding ground pads 320.

At 606, it may be determined whether there is another interposer 203 of an interposer wafer 300 obtained at 601 in order to form another stacked die 200. At 606, such other interposer 203 may be determined with testing information from a wafer sort of such wafer 300. If at 606 it is determined that there is another interposer 203 of such wafer 300 to process, then at 606 such other interposer 203 is accessed for grounding at 602. Along those lines, a machine used to perform die attach may move one or more grounded probes 590 from one interposer to another interposer of a same interposer wafer for grounding thereof at 602. If, however, at 606 it is determined that there is no other interposer 203 of such wafer 300 to process, then such machine at 606 may unload the previously processed wafer for forming stacked dies 200 and load another wafer 300 at 601 for forming more stacked dies 200, as previously described.

Stacked dies 200 on an interposer 203 may be diced therefrom to provide separated stacked dies 200. Flow 600 was described for a Chip-on-Wafer process flow. However, rather than loading interposer wafers at 601, an individual interposer 203 may be loaded for flow 600 to be a Chip-on-Chip process flow. Thus, at 606 it would be determined whether there was another interposer 203 to process, and if there was not, then flow 600 may end.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:
1. An apparatus, comprising:
a passive interposer having a plurality of conductors for coupling two or more integrated circuit dies to the interposer to provide a stacked die and one or more microbumps extending from one or more microbump pads, the microbumps configured for coupling to the two or more integrated circuit dies;
wherein the interposer includes an exposed conductive pad disposed outward and clear of areas of the interposer configured to receive the two or more integrated circuit dies, the exposed conductive pad coupled to a conductive network of the interposer configured to dissipate electrostatic charge from the interposer prior to the two or more integrated circuit dies being coupled to the interposer, and
wherein the exposed conductive pad has a larger plan area than each of the one or more microbump pads.
2. The apparatus according to claim 1, wherein the exposed conductive pad is located at periphery of the plurality of conductors.
3. The apparatus according to claim 2, wherein both the exposed conductive pad and the plurality of conductors are located on a front side surface of the interposer.
4. The apparatus according to claim 1, wherein the exposed conductive pad of the interposer is one of a plurality of four ground pads respectively located in corners of a first side surface of the interposer and coupled to the conductive network.
5. The apparatus according to claim 2, wherein the interposer is formed with a dielectric substrate.

6. The apparatus according to claim 3, wherein the dielectric substrate is a silicon oxide.

7. The apparatus according to claim 3, wherein:
the conductive network is a first conductive network;
the exposed conductive pad is a first pad;
the interposer includes a second pad coupled to a second conductive network of the interposer;
wherein the second pad is located on the periphery of the plurality of conductors and both the first pad, the second pad, and the plurality of conductors are located on the front side surface of the interposer.

8. The apparatus according to claim 7, wherein:
the first conductive network is a ground network;
the second conductive network is a supply voltage network;
a first portion of the plurality of conductors is coupled to the ground network; and
a second portion of the plurality of conductors is coupled to the supply voltage network.

9. The apparatus according to claim 1, wherein:
the interposer is a first interposer; and
the first interposer is part of an interposer wafer including a second interposer.

10. The apparatus according to claim 9, wherein:
the plurality of conductors is a first plurality of conductors;
the stacked die is a first stacked die;
the integrated circuit dies include a first integrated circuit die;
the exposed conductive pad is a first exposed conductive pad;
the conductive network is a first conductive network;
the second interposer has a second plurality of conductors for coupling a second integrated circuit die to the second interposer to provide a second stacked die;
the second interposer includes a second exposed conductive pad coupled to a second conductive network of the second interposer;
the second pad is located at periphery of the second plurality of conductors and both the second pad and the second plurality of conductors are located on a front side surface of the second interposer.

11. A method, comprising:
loading a passive interposer having a plurality of conductors for coupling two or more integrated circuit dies to the interposer to provide a stacked die and one or more microbumps extending from one or more microbump pads;
grounding the interposer with a grounded probe;
wherein the grounded probe is put in mechanical contact with an exposed conductive pad on the interposer, the exposed conductive pad coupled to a conductive network of the interposer configured for the grounding thereof to dissipate electrostatic charge from the interposer prior to the two or more integrated circuit dies being coupled to the interposer, the exposed conductive pad disposed outward and clear of areas of the interposer configured to receive the two or more integrated circuit dies, wherein the exposed conductive pad has a larger plan area than each of the one or more microbump pads; and
coupling the two or more integrated circuit dies to the interposer via the microbumps extending from the microbump pads of the two or more integrated circuit dies while grounded via the grounded probe to provide the stacked die, wherein the exposed conductive pad has a larger plan area than each of the microbump pads.

12. The method according to claim 11, wherein:
the two or more integrated circuit dies include a first integrated circuit die;
the interposer is a first interposer; and
the method further comprises coupling a second integrated circuit die of the two or more integrated circuit dies to the first interposer while maintaining the grounding thereof to provide the stacked die.

13. The method according to claim 11, wherein the exposed conductive pad of the interposer is coupled to a ground network of the interposer.

14. The method according to claim 11, wherein:
the interposer comprises a substrate; and
the substrate is a dielectric substrate.

* * * * *